US009634618B2

(12) United States Patent
Xue et al.

(10) Patent No.: US 9,634,618 B2
(45) Date of Patent: Apr. 25, 2017

(54) IMPEDANCE MATCHING ARRANGEMENT FOR AN AMPLIFIER

(71) Applicant: City University of Hong Kong, Kowloon (HK)

(72) Inventors: Quan Xue, Kowloon (HK); Haiwai Zhang, Kowloon (HK); Kam Man Shum, Kowloon (HK)

(73) Assignee: City University of Hong Kong, Hong Kong (HK)

( * ) Notice: Subject to any disclaimer, the term of this patent is extended or adjusted under 35 U.S.C. 154(b) by 0 days.

(21) Appl. No.: 14/803,296

(22) Filed: Jul. 20, 2015

(65) Prior Publication Data

US 2017/0026009 A1   Jan. 26, 2017

(51) Int. Cl.
H03F 3/45 (2006.01)
H03F 1/56 (2006.01)
H03F 1/02 (2006.01)
H03F 3/19 (2006.01)
H03F 3/21 (2006.01)

(52) U.S. Cl.
CPC ........... *H03F 1/565* (2013.01); *H03F 1/0205* (2013.01); *H03F 3/19* (2013.01); *H03F 3/211* (2013.01); *H03F 3/45076* (2013.01); *H03F 2200/451* (2013.01); *H03F 2203/21103* (2013.01)

(58) Field of Classification Search
CPC ..................................................... H03F 1/0205
USPC ................................. 330/124 R, 295; 333/33
See application file for complete search history.

(56) References Cited

U.S. PATENT DOCUMENTS 7,825,731 B2 * 11/2010 Ohnishi .................. H03F 1/565
                                                              330/126

OTHER PUBLICATIONS

Li, et al., "Parasitic-insensitive linearization methods for 60-GHz 90-nm CMOS LNAs," IEEE Trans. Microw. Theory Tech., vol. 60, No. 8, pp. 2512-2523 (Aug. 2012).
Huang, et al., "Low-power, high-gain V-band CMOS low noise amplifier for microwave radiometer applications," IEEE Microw. Wireless Compon. Lett., vol. 21, No. 2, pp. 104-106 (Feb. 2011).
Yu, et al., "A 60 GHz phase shifter integrated with LNA and PA in 65 nm CMOS for phased array systems," IEEE J. Solid-State Cir-cuits, vol. 45, No. 9, pp. 1697-1709 (Sep. 2010).
Tsai, et al., "Design of 60-GHz low-noise amplifiers with low NF and robust ESD protection in 65-nm CMOS," IEEE Trans. Microw. Theory Tech., vol. 61, No. 1, pp. 553-561 (Jan. 2013).
Yeh, et al., "Analysis and design of millimeterwave low-voltage CMOS cascode LNA with magnetic coupled technique," IEEE Trans. Microw. Theory Tech., vol. 60, No. 12, pp. 4066-4079 (Dec. 2012).

(Continued)

Primary Examiner — Khanh V Nguyen
Assistant Examiner — Khiem Nguyen
(74) Attorney, Agent, or Firm — Renner Kenner Greive Bobak Taylor & Weber

(57) ABSTRACT

An impedance matching arrangement for an amplifier includes first and second metallic transmission lines arranged on a ground plane, the first metallic transmission line being connected with a first power amplification stage of the amplifier, the second metallic transmission line being connected with a second power amplification stage of the amplifier; wherein the first and second metallic transmission lines are electrically coupled for transmitting an RF signal amplified by the first power amplification stage to the second power amplification stage.

22 Claims, 6 Drawing Sheets

(56) References Cited

OTHER PUBLICATIONS

Kim, et al., "A 60 GHz wideband phased-array LNA with short-stub passive vector generator," IEEE Microw. Wireless Compon. Lett., vol. 20, No. 11, pp. 628-630 (Nov. 2010).
Aloui, et al., "High-gain and linear 60-GHz power amplifier with a thin digital 65-nm CMOS technology," IEEE Trans Microw. Theory Tech., vol. 61, No. 6, pp. 2425-2437 (Jun. 2013).

* cited by examiner

IMPEDANCE MATCHING ARRANGEMENT FOR AN AMPLIFIER

TECHNICAL FIELD

The present invention relates to an impedance matching arrangement for an amplifier and an amplifier incorporating the same. More particularly, although not exclusively, the present invention relates to an impedance matching arrangement with multi-sectioned coupled transmission lines for impedance matching between two power amplification stages in an amplifier.

BACKGROUND

An increasing demand for high data-rate short range wireless communication in consumer products such as mobile electronic devices exists. Currently, the trend for the operation frequencies of wireless communication is moving from the relatively crowded lower frequency band to higher millimeter wave range such as 60 GHz. This trend has driven the development of high performance 60 GHz amplifier systems, or more generally, millimeter wave MMIC circuits and devices.

A high gain and wideband amplifier is desirable for implementing millimeter wave MMIC circuits and devices. To realize high gain and wideband, the amplifier needs to have one or more impedance matching arrangement for matching the source and load impedances, for example, between different amplification stages so as to achieve maximum power transfer or amplification.

SUMMARY OF THE INVENTION

In accordance with a first aspect of the present invention, there is provided an impedance matching arrangement for an amplifier, comprising: first and second metallic transmission lines arranged on a ground plane, the first metallic transmission line being connected with a first power amplification stage of the amplifier, the second metallic transmission line being connected with a second power amplification stage of the amplifier; wherein the first and second metallic transmission lines are electrically coupled for transmitting an RF signal amplified by the first power amplification stage to the second power amplification stage.

In one embodiment of the first aspect, the first and second metallic transmission lines together define a first coupled section at one end thereof, a second coupled section at another end thereof, and an uncoupled section between the first and second coupled sections.

In one embodiment of the first aspect, the RF signal is transmitted from the first metallic transmission line to the second metallic transmission line through the first coupled section and/or the second coupled section.

In one embodiment of the first aspect, the impedance matching arrangement is at least partly RF shorted such that substantially no RF signal is transmitted from the second transmission line to the first transmission line.

In one embodiment of the first aspect, separations between the first and second metallic transmission lines in the first and second coupled sections are smaller than a separation between the first and second metallic transmission lines in the uncoupled section.

In one embodiment of the first aspect, the first and second metallic transmission lines are symmetrically disposed on the ground plane.

In one embodiment of the first aspect, the first metallic transmission line define a first port and a second port, the second metallic transmission line defines a third port and a fourth port, the first and third ports being arranged at the first coupled section, and the second and fourth ports being arranged at the second coupled section; wherein the first port of the first metallic transmission line is connected with a first power amplification stage, and the fourth port of the second metallic transmission line is connected with a second power amplification stage.

In one embodiment of the first aspect, the second port and the third port are RF shorted such that substantially no RF signal is transmitted between the second port and the third port.

In one embodiment of the first aspect, the first and second power amplification stages each comprise a cascode amplifier circuit.

In one embodiment of the first aspect, the amplifier is a CMOS amplifier arranged to operate at 60 GHz.

In accordance with a second aspect of the present invention, there is provided an amplifier, comprising: an RF input arranged to receive an RF signal to be amplified; an RF output arranged output the amplified RF signal; first and second power amplification stages arranged between the RF input and the RF output for amplifying the RF signal, each of the first and second power amplification stages having two input ports and two output ports; wherein two impedance matching arrangements are arranged between the first and second power amplification stages, each impedance matching arrangement comprises: first and second metallic transmission lines arranged on a ground plane, the first metallic transmission line being connected with an output port of first power amplification stage, the second metallic transmission line being connected with an input port of the second power amplification stage; wherein the first and second metallic transmission lines are electrically coupled for transmitting the RF signal from the first power amplification stage to the second power amplification stage; and wherein the two impedance matching arrangements are electrically connected, with each impedance matching arrangement connected with a respective output port of the first power amplification stage and a respective input port of the second power amplification stage In one embodiment of the second aspect, for each individual impedance matching arrangement, the first and second metallic transmission lines together define a first coupled section at one end thereof, a second coupled section at another end thereof, and an uncoupled section between the first and second coupled sections.

In one embodiment of the second aspect, for each individual impedance matching arrangement, the RF signal is transmitted from the first metallic transmission line to the second metallic transmission line through the first coupled section and/or the second coupled section.

In one embodiment of the second aspect, for each individual impedance matching arrangement, the impedance matching arrangement is at least partly RF shorted such that substantially no RF signal is transmitted from the second transmission line to the first transmission line.

In one embodiment of the second aspect, the first metallic transmission lines of the two impedance matching arrangements are electrically connected.

In one embodiment of the second aspect, for each individual impedance matching arrangement, the first metallic transmission line define a first port and a second port, the second metallic transmission line defines a third port and a fourth port, the first and third ports being arranged at the first coupled section, and the second and fourth ports being arranged at the second coupled section; wherein the first port of the first metallic transmission line is connected with an output port of the first power amplification stage, and the fourth port of the second metallic transmission line is connected with an input port of the second power amplification stage.

In one embodiment of the second aspect, for each individual impedance matching arrangement, the second port and the third port are RF shorted such that substantially no RF signal is transmitted between the second port and the third port.

In one embodiment of the second aspect, the second ports of the two impedance matching arrangements are electrically connected.

In one embodiment of the second aspect, the third ports of the two impedance matching arrangements are at the same reference voltage.

In one embodiment of the second aspect, the first and second power amplification stages each comprise a cascode amplifier circuit.

In one embodiment of the second aspect, the cascode amplifier circuit comprises two transistors in common-source common-gate configuration.

In one embodiment of the second aspect, the amplifier comprises further power amplification stages and further impedance matching arrangements arranged between any two power amplifications stages.

In one embodiment of the second aspect, the amplifier is a differential amplifier.

In one embodiment of the second aspect, the amplifier is a CMOS amplifier arranged to operate at 60 GHz.

It is an object of the present invention to address the above needs, to overcome or substantially ameliorate the above disadvantages or, more generally, to provide an improved impedance matching arrangement for an amplifier, in particular, a 60 GHz CMOS amplifier.

BRIEF DESCRIPTION OF THE DRAWINGS

Embodiments of the present invention will now be described, by way of example, with reference to the accompanying drawings in which.

DETAILED DESCRIPTION OF ILLUSTRATIVE EMBODIMENTS

The Inventors of the present invention have devised, through experiments and trials, that high gain and wideband impedance matching for 60 GHz applications is difficult to realize due to the presence of complex parasitic components in the circuit, especially in CMOS technology. The Inventors of the present invention have also devised, through experiments and trials, that impedance matching networks which can be used in the design of 60 GHz amplifiers or MMIC circuits include transmission line matching, inductor and capacitor matching, and transformer matching. Through the experiments and trials, the Inventors have realized that transmission line matching which uses a single transmission of specific length and characteristic impedance is capable of performing conjugate matching, but is relative large in size which leads to high cost in terms of chip area. On the other hand, the Inventors have realized that inductor and capacitor matching, and transformer matching are relatively small in size; and transformer matching has inherent DC block function, which can separate the DC path of the power amplification stages in an amplifier. Through the experiments and trials, the Inventors have realized several problems with inductor and capacitor matching, and transformer matching. Firstly, on-chip inductors used in inductor and capacitor matching, and transformers used in transformed matching, are made of spiral or coiled wires with defected ground which promotes mutual magnetic coupling. This defected ground would in turn create a higher resistance and inductance in a ground plane, and hence deteriorate the performance of high frequency integrated circuit. Second, a self-resonant frequency exists in inductor and capacitor matching and transformer matching circuits due to the inductors/transformers and the inevitable parasitic capacitance.

Figure 1:
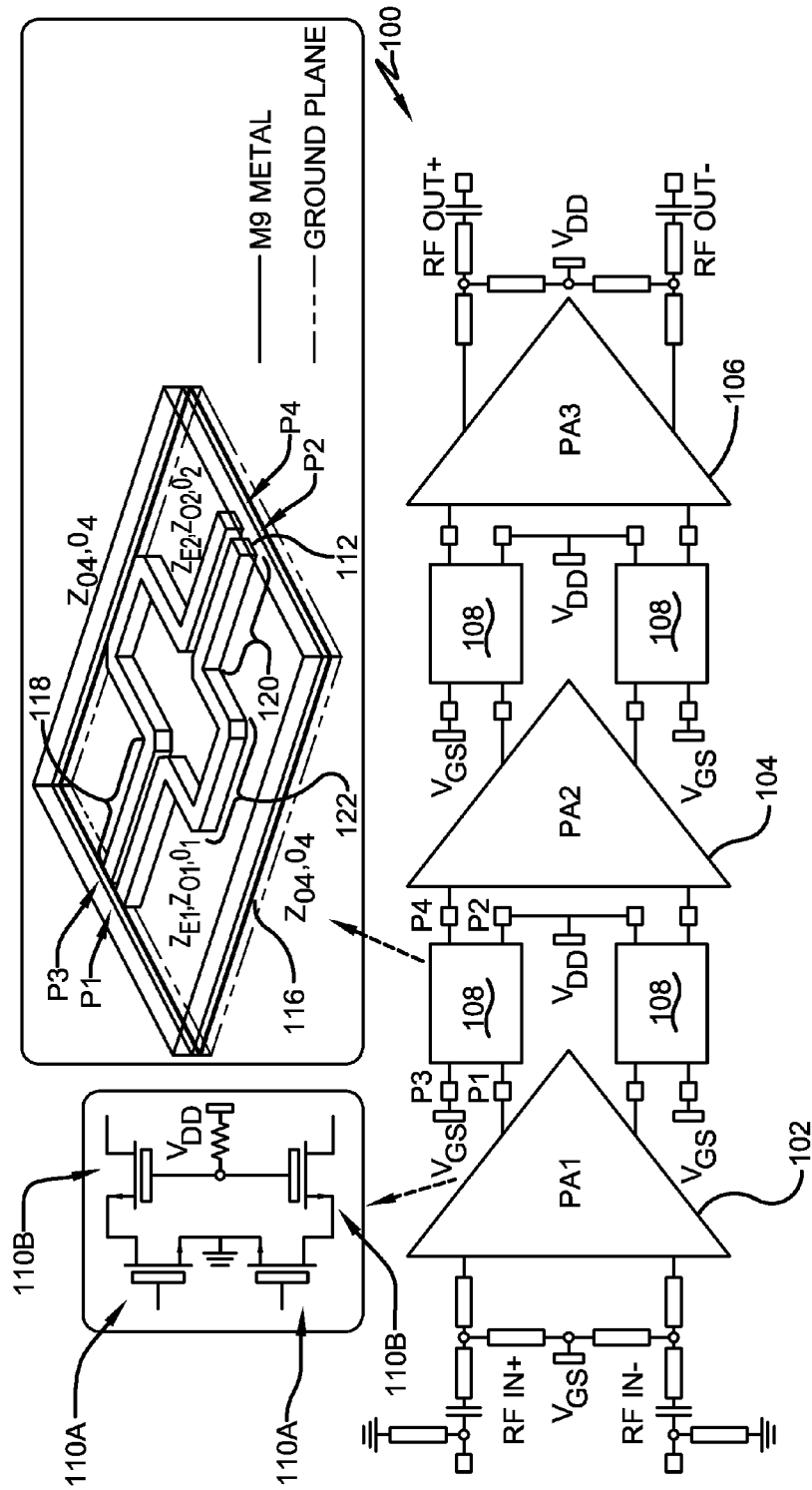
FIG. 1 is a simplified circuit diagram of an amplifier with two impedance matching arrangements arranged between two power amplification stages in accordance with one embodiment of the present invention.

Referring to FIG. 1, there is provided an impedance matching arrangement 108 for an amplifier 100, comprising first and second metallic transmission lines 112, 114 arranged on a ground plane 116, the first metallic transmission line 112 being connected with a first power amplification stage of the amplifier 110, the second metallic transmission line 114 being connected with a second power amplification stage of the amplifier 110; wherein the first and second metallic transmission lines 112, 114 are electrically coupled for transmitting an RF signal amplified by the first power amplification stage to the second power amplification stage.

As shown in FIG. 1, the amplifier circuit 100 in one embodiment of the present invention includes an RF input (RFin+, RFin−) arranged to receive an RF signal to be amplified; three power amplification stages 102, 104, 106 connected with the RF input for amplifying the RF signal; and an RF output (RFout+, RFout−) arranged output the amplified RF signal. Each of the power amplification stage 102, 104, 106 is a cascode amplifier circuit which includes two input ports and two output ports. The input ports of the first power amplification stage 102 are connected with the RF input (RFin+, RFin−), and the output ports of the third power amplification stage 106 are connected with the RF output (RFout+, RFout−). The first and second power amplification stages 102, 104 are connected through two impedance matching arrangements 108 which are preferably identical. The second and third power amplification stages 104, 106 are also connected through two impedance matching arrangements 108 which are preferably identical. In other embodiments, at least one of the impedance matching arrangements may not be the same as the rest.

In the present embodiment, the cascode amplifier circuit of each power amplification stage 102, 104, 106 includes four transistors 110a, 110b (MOSFETs). Taking the cascode amplifier circuit in the first power amplification stage 102 as an example, a first pair of upstream transistors with their source terminals connected to common ground is arranged to receive RF input signal from the RF input (RFin+, RFin−). The drain terminals of each of these transistors 110a are in turn connected with a respective source terminal of a downstream pair of transistors 110b. The gate terminals of the downstream pair of transistors 110b are connected together and to a common reference voltage $V_{dd}$. The transistors in the present embodiment are connected in common-source common-gate configuration. However, in other embodiments, other cascode circuits such as single common source cascode circuit or multi stacked cascode circuit may also be used in the power amplification stages.

In the present invention, each impedance matching arrangement 108 includes a pair of metallic transmission lines 112, 114 arranged on a ground plane 116. For each impedance matching arrangement 108, a first transmission line 112 is connected with an output port (drain terminal of the downstream transistors) of one power amplification stage, and a second transmission line 114 is connected with an input port (gate terminal of the upstream transistors) of the next power amplification stage. The first and second transmission lines 112, 114 are electrically coupled so as to transmit RF signal outputted from one power amplification stage to the next power amplification stage.

In the present invention, each impedance matching arrangement 108 is multi-sectioned for electrically coupling the first and second transmission lines 112, 114. Specifically, the first and second transmission lines 112, 114 of the same impedance matching arrangement together define a first coupled section 118 at one end, a second coupled section 120 at another end, and an uncoupled section 122 between the first and second coupled sections 118, 120. Preferably, the separations between the first and second metallic transmission lines 112, 114 in the first coupled section 118 and in the second coupled section 120 are smaller than a separation between the first and second metallic transmission lines 112, 114 in the uncoupled section 122. The length of the first coupled section 118 and the length of the second coupled section 120 may be the same. The lengths of the first and second transmission lines 112, 114 in the uncoupled section 122 may also be the same. The first and second transmission lines 112, 114 preferably have various characteristic lengths and impedances at the first coupled section 118, the second coupled section 120 and the uncoupled section 122, the specific values of which depends on specific amplifier applications or operation requirements. In the present embodiment, the first and second transmission lines 112, 114 are symmetrically disposed on the ground plane 116 along a lengthwise direction of the lines 112, 114. In some embodiments, one or more of the impedance matching arrangements 108 in the amplifier circuit 100 may lack an uncoupled section 122.

In a preferred embodiment, the first transmission line 112 defines a first port P1 and second port P2 at both ends. Likewise, the second transmission line defines a third port P3 and a fourth port P4 at both ends, with the third port P3 being adjacent the first port P1, and the fourth port P4 being adjacent the second port P2. In the present embodiment, the first and third ports P1, P3 are arranged at the first coupled section 118, and the second and fourth ports P2, P4 are arranged at the second coupled section 120. The first port P1 of the first metallic transmission line 112 is connected with an output port (drain terminal of the downstream transistors) one power amplification stage, and the fourth port P4 of the second metallic transmission line 114 is connected with an input port (gate terminal of the downstream transistors) of the next amplification stage.

In the present invention, each impedance matching arrangement 108 enables RF signal to be transmitted from the first transmission line 112 to the second transmission line 114 through both the first and second coupled sections 118, 120, but is also partly RF shorted such that substantially no RF signal is transmitted from the second transmission line 114 to the first transmission line 112. In other words, the second and third ports P2, P3 of the arrangement 108 are RF shorted. In one embodiment, the impedance matching arrangement 108 may enable RF signal to be transmitted from the first transmission line 112 to the second transmission line 114 through only one of the first and second coupled sections 118, 120.

Referring back the FIG. 1, the two impedance matching arrangements 108 in between two power amplification stages are electrically connected, with each impedance matching arrangement 108 connected with a respective output port (drain terminal of the downstream transistors) of the first power amplification stage 102 and a respective input port (gate terminal of the upstream transistors) of the second power amplification stage 104. The first metallic transmission lines 112 of the two impedance matching arrangements 108 are electrically connected. Specifically, the second ports P2 of the two impedance matching arrangements 108 are electrically connected, and are at reference voltage $V_{dd}$. The third ports P3 of the two impedance matching arrangements 108 are at the same reference voltage $V_g$. The impedance matching arrangements 108 between any two power amplification stages in the exemplary amplifier 100 of FIG. 1 are connected in a substantially identical manner.

Figure 2:
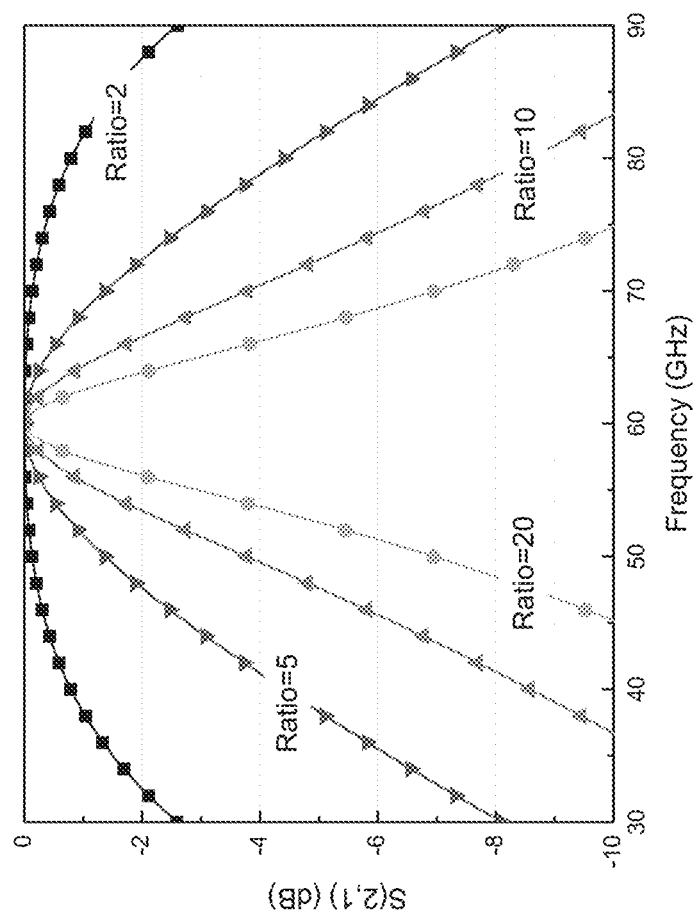
FIG. 2 is a graph showing the frequency response of the impedance matching arrangement of FIG. 1 for different impedance transformation ratios.

FIG. 2 shows the frequency response of the amplifier 100 with the impedance matching arrangement 108 of FIG. 1 for different impedance transformation ratios. As the amplifier 100 of FIG. 1 is adapted to operate best at 60 GHz, all ratio curves peak at around 60 GHz, meaning that most efficient power transfer occurs at around 60 GHz. As shown in FIG. 2, the larger the impedance transformation ratio, the narrower the operation bandwidth.

Figure 3:
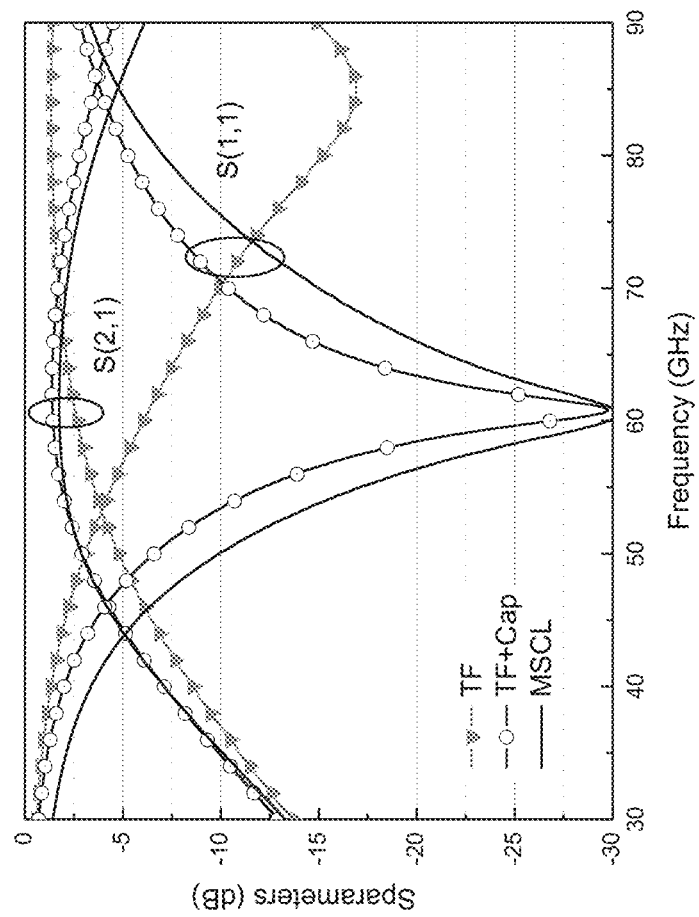
FIG. 3 is a graph of simulated results comparing scattering parameters (S11, S21) at different frequencies for different inter-stage matching techniques between two power amplification stages, the inter-stage matching techniques include the impedance matching arrangement of FIG. 1, and a transformer matching network.

FIG. 3 shows simulated results comparing scattering parameters (S11, S21) at different frequencies for different inter-stage (i.e., inter amplification stages) matching techniques between two power amplification stages, the inter-stage matching techniques include the impedance matching arrangement 108 of FIG. 1 and a transformer matching network. In the simulation of FIG. 3, the input and load impedances used are 27.6+15j and 11.3-43j, respectively. With loss tangent of 0.02 and conductivity value of 4.8e7 S/m, the simulated insertion losses for the impedance matching arrangement 108 of FIG. 1 and transformer matching network are −1.63 dB and −1.45 dB, respectively. Although the bandwidth performance of transformer matching network is comparable with the impedance matching arrangement 108 of FIG. 1, an additional 17 fF MIM capacitor is required to be placed in parallel with the secondary inductor of the transformer matching network in order to complete the conjugate matching. This introduces error to the fabrication process and brings bandwidth limitations to the amplifier.

To verify and test the performance of the impedance matching arrangement 108 (inter-stage matching) of the present invention, a 60 GHz differential amplifier was designed and implemented in 65 nm 1 dB CMOS technology based on the circuit diagram of FIG. 1. In the design of the amplifier, the high frequency transistor models were obtained by adding parasitic components extracted from Caliber RCX to the corresponding ports. A tradeoff in gain, 1 dB compression point and stability, as well as DC power consumption had been made to determine the transistor sizes of the amplifier. An RF shorted transmission line is employed as part of the input matching network for electrostatic discharge protection. In order to achieve maximum power transfer, a T-type matching network is used to connect the output port of the amplifier to a double balanced mixer. The impedance matching arrangement was fabricated based on the construction shown in FIG. 1. A thick metal layer of M9 is used for construction of the transmission lines on a ground plane. Restricted by the 65 nm CMOS layout size, the even- and odd-mode impedances of the transmission lines at the coupled sections are fixed to the value of 65Ω and 23.5Ω, with a transmission line width and line space of 5 μm and 2 μm respectively. The impedance of uncoupled section of the transmission lines was selected to be 50Ω (5 μm). The final optimized parameters for each of the impedance matching arrangement in the designed amplifier are summarized in Table I. These parameters are obtained using the Smith-chart during the inter-stage matching procedure since it can provides a clear matching mechanism by parameters sweeping. The core chip area of the fabricated differential amplifier is 0.274 mm². A number of measurements (FIGS. 4-6) were carried out by on-wafer probing with all DC pads of the fabricated differential amplifier wire-bonded.

TABLE 1

| $Z_{e1}$ | $Z_{o1}$ | $\theta_1$ | $Z_{e2}$ | $Z_{o2}$ | $\theta_2$ | $Z_{O3}$ | $\theta_3$ | $Z_{O4}$ | $\theta_4$ |
|---|---|---|---|---|---|---|---|---|---|
| Parameters of impedance matching arrangement 108 between first and second power amplification stages 102 and 104 (Ω, deg) ||||||||||
| 65 | 23.5 | 11.7 | 65 | 23.5 | 8.5 | 50 | 17 | 50 | 6.2 |
| Parameters of impedance matching arrangement 108 between second and third power amplification stages 104 and 106 (Ω, deg) ||||||||||
| 65 | 23.5 | 5.8 | 65 | 23.5 | 8.2 | — | — | — | — |

Figure 4:
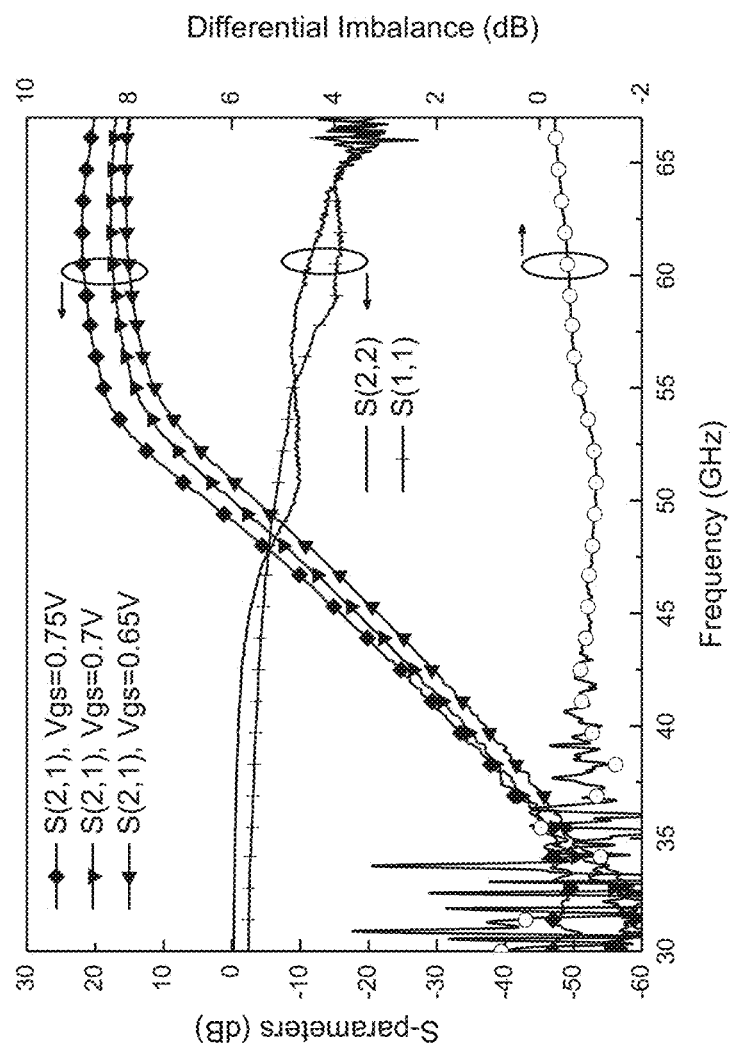
FIG. 4 is a graph showing the scattering parameters (S11, S21 and S22) measured from an amplifier fabricated based on the circuit diagram of FIG. 1.

FIG. 4 shows the scattering parameters (S11, S21 and S22) of the fabricated differential amplifier obtained using a microwave network analyser (Agilent N5247A). As shown in FIG. 4, the fabricated amplifier exhibits a small-signal gain over 20 dB. The achieved 3-dB bandwidth ranges from 54 to 67 GHz, with the required 7 GHz bandwidth (57-64 GHz) fully and well covered. More than −10 dB input and output return loss is achieved within the bandwidth. The small-signal gain varied from 20 dB to 13.7 dB as the biasing voltage changing from 0.75 V to 0.65 V.

Figure 5:
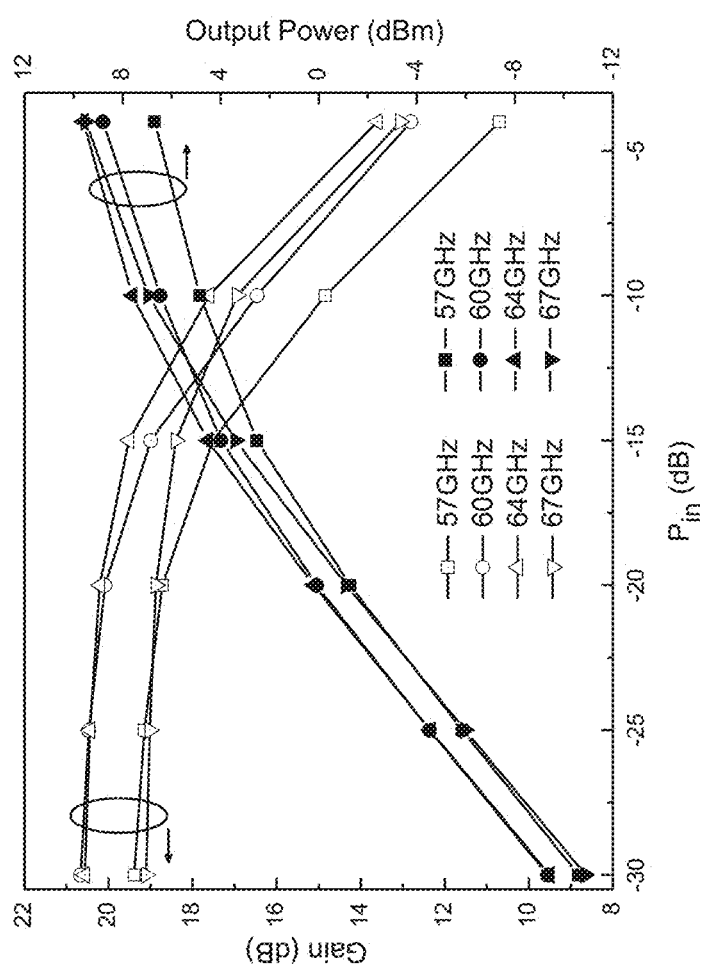
FIG. 5 is a graph showing the gain compression at different frequencies measured from the amplifier fabricated based on the circuit diagram of FIG. 1.

FIG. 5 shows the large signal measurement for gain compression at different frequencies measured from the fabricated amplifier. As shown in FIG. 5, the maximum achieved OP1 dB is around 5 dBm at 64 GHz, indicating high linearity of the design.

Figure 6:
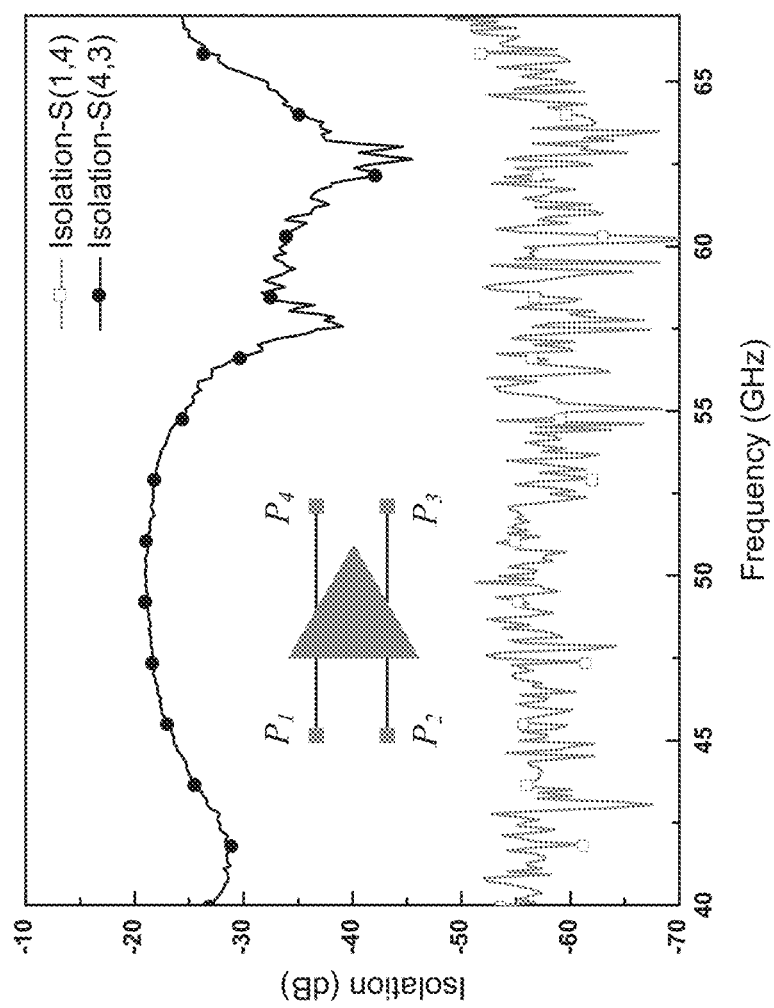
FIG. 6 is a graph showing the gain imbalance and isolation measurement measured from the amplifier fabricated based on the circuit diagram of FIG. 1.

FIG. 6 shows the measured gain imbalance and isolation results. Due to the elimination of defected ground using the impedance matching arrangement of FIG. 1, good balanced output is obtained with less than 0.7 dB imbalance within the required bandwidth. The measured maximum reverse and output-port isolation of the amplifier are better than −60 dB and −40 dB respectively.

Although the circuit shown in FIG. 1 includes three power amplification stages, a person skilled in the art would readily appreciate that the amplifier of the present invention may include less than (e.g., two) or more than three power amplification stages, and may include further impedance matching arrangements arranged between any two power amplifications stages. Also, although the impedance matching arrangement in FIG. 1 is implemented in an exemplary CMOS differential amplifier which has the advantage of common-mode rejection and even order distortion cancellation, other types of amplifiers or millimeter wave MMIC circuits can also implement the impedance matching arrangement of FIG. 1. The impedance matching arrangement and the amplifier in the present invention are particularly adapted for 60 GHz applications, although they are also applicable in other frequency bands through suitable optimizations.

The impedance matching arrangement in the present invention comprises two transmission lines defining two coupled sections and an uncoupled section for enabling power transfer between two power amplification stages. Specifically, the impedance matching arrangement is in the form of a two-port matching network, with two diagonal ports being RF shorted.

The impedance matching arrangement of the present invention can perform conjugate matching, as the multi-section coupled topology of the impedance matching arrangement owns additional line section compared with conventional coupled line. Complex impedance transforming can be realized by optimizing the parameters of each section of the impedance matching arrangement. The impedance matching arrangement is also advantageous as it has a simple structure, and yet can achieve high impedance transforming and conjugate matching. Advantageously, the impedance matching arrangement has DC-block function without requiring the use of DC block capacitors. As there is no need for any additional DC block capacitors, the circuit layout can be smaller and simpler, making it more suitable for next generation devices. The impedance matching arrangement in the present invention also does not introduce self-resonant and defected ground problems, as transformer or inductor components are not used.

The impedance matching arrangement in the embodiments of the present invention is very suitable for high performance millimeter wave circuit design. By incorporating the impedance matching arrangement, the high performance amplifier of the present invention is high performance is most suitable for next generation wireless communication devices.

It will be appreciated by persons skilled in the art that further variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. An impedance matching arrangement for an amplifier, comprising:
   first and second metallic transmission lines arranged on a ground plane, the first metallic transmission line being connected with a first power amplification stage of the amplifier, the second metallic transmission line being connected with a second power amplification stage of the amplifier;

wherein the first and second metallic transmission lines are electrically coupled for transmitting an RF signal amplified by the first power amplification stage to the second power amplification stage; wherein the first and second metallic transmission lines together define a first coupled section at one end thereof, a second coupled section at another end thereof, and an uncoupled section between the first and second coupled sections.

2. The impedance matching arrangement in accordance with claim 1, wherein the RF signal is transmitted from the first metallic transmission line to the second metallic transmission line through the first coupled section and/or the second coupled section.

3. The impedance matching arrangement in accordance with claim 2, wherein the impedance matching arrangement is at least partly RF shorted such that substantially no RF signal is transmitted from the second transmission line to the first transmission line.

4. The impedance matching arrangement in accordance with claim 1, wherein separations between the first and second metallic transmission lines in the first and second coupled sections are smaller than a separation between the first and second metallic transmission lines in the uncoupled section.

5. The impedance matching arrangement in accordance with claim 1, wherein the first and second metallic transmission lines are symmetrically disposed on the ground plane.

6. The impedance matching arrangement in accordance with claim 1, wherein the first metallic transmission line define a first port and a second port, the second metallic transmission line defines a third port and a fourth port, the first and third ports being arranged at the first coupled section, and the second and fourth ports being arranged at the second coupled section; wherein the first port of the first metallic transmission line is connected with the first power amplification stage, and the fourth port of the second metallic transmission line is connected with the second power amplification stage.

7. The impedance matching arrangement in accordance with claim 6, wherein the second port and the third port are RF shorted such that substantially no RF signal is transmitted between the second port and the third port.

8. The impedance matching arrangement in accordance with claim 1, wherein the amplifier is a CMOS amplifier arranged to operate at 60 GHz.

9. An impedance matching arrangement for an amplifier comprising:
   first and second metallic transmission lines arranged on a ground plane, the first metallic transmission line being connected with a first power amplification stage of the amplifier, the second metallic transmission line being connected with a second power amplification stage of the amplifier; wherein the first and second metallic transmission lines are electrically coupled for transmitting an RF signal amplified by the first power amplification stage to the second power amplification stage, wherein the first and second power amplification stages each comprises a cascode amplifier circuit.

10. An amplifier, comprising:
    an RF input arranged to receive an RF signal to be amplified;
    an RF output arranged output the amplified RF signal;
    first and second power amplification stages arranged between the RF input and the RF output for amplifying the RF signal, each of the first and second power amplification stages having two input ports and two output ports;
    wherein two impedance matching arrangements are arranged between the first and second power amplification stages, each impedance matching arrangement comprises:
        first and second metallic transmission lines arranged on a ground plane, the first metallic transmission line being connected with an output port of first power amplification stage, the second metallic transmission line being connected with an input port of the second power amplification stage; wherein the first and second metallic transmission lines are electrically coupled for transmitting the RF signal from the first power amplification stage to the second power amplification stage; and
    wherein the two impedance matching arrangements are electrically connected, with each impedance matching arrangement connected with a respective output port of the first power amplification stage and a respective input port of the second power amplification stage; wherein for each individual impedance matching arrangement, the first and second metallic transmission lines together define a first coupled section at one end thereof, a second coupled section at another end thereof, and an uncoupled section between the first and second coupled sections.

11. The amplifier in accordance with claim 10, wherein for each individual impedance matching arrangement, the RF signal is transmitted from the first metallic transmission line to the second metallic transmission line through the first coupled section and/or the second coupled section.

12. The amplifier in accordance with claim 11, wherein for each individual impedance matching arrangement, the impedance matching arrangement is at least partly RF shorted such that substantially no RF signal is transmitted from the second transmission line to the first transmission line.

13. The amplifier in accordance with claim 10, wherein the first metallic transmission lines of the two impedance matching arrangements are electrically connected.

14. The amplifier in accordance with claim 10, wherein for each individual impedance matching arrangement, the first metallic transmission line define a first port and a second port, the second metallic transmission line defines a third port and a fourth port, the first and third ports being arranged at the first coupled section, and the second and fourth ports being arranged at the second coupled section; wherein the first port of the first metallic transmission line is connected with an output port of the first power amplification stage, and the fourth port of the second metallic transmission line is connected with an input port of the second power amplification stage.

15. The amplifier in accordance with claim 14, wherein for each individual impedance matching arrangement, the second port and the third port are RF shorted such that substantially no RF signal is transmitted between the second port and the third port.

16. The amplifier in accordance with claim 14, wherein the second ports of the two impedance matching arrangements are electrically connected.

17. The amplifier in accordance with claim 14, wherein the third ports of the two impedance matching arrangements are at the same reference voltage.

18. The amplifier in accordance with claim 10, wherein the amplifier comprises further power amplification stages and further impedance matching arrangements arranged between any two power amplifications stages.

19. The amplifier in accordance with claim 10, wherein the amplifier is a differential amplifier.

20. The amplifier in accordance with claim 10, wherein the amplifier is a CMOS amplifier arranged to operate at 60 GHz.

21. An amplifier comprising
an RF input arranged to receive an RF signal to be amplified;
an RF output arranged output the amplified RF signal;
first and second power amplification stages arranged between the RF input and the RF output for amplifying the RF signal, each of the first and second power amplification stages having two input ports and two output ports;
wherein two impedance matching arrangements are arranged between the first and second power amplification stages, each impedance matching arrangement comprises:
first and second metallic transmission lines arranged on a ground plane, the first metallic transmission line being connected with an output port of first power amplification stage, the second metallic transmission line being connected with an input port of the second power amplification stage; wherein the first and second metallic transmission lines are electrically coupled for transmitting the RF signal from the first power amplification stage to the second power amplification stage; and
wherein the two impedance matching arrangements are electrically connected, with each impedance matching arrangement connected with a respective output port of the first power amplification stage and a respective input port of the second power amplification stage, wherein the first and second power amplification stages each comprises a cascode amplifier circuit.

22. The amplifier in accordance with claim 21, wherein the cascode amplifier circuit comprises two transistors in common-source common-gate configuration.

* * * * *